(12) United States Patent
Wu et al.

(10) Patent No.: US 11,870,329 B2
(45) Date of Patent: Jan. 9, 2024

(54) AIR-COOLED RADIATOR

(71) Applicant: NANCHANG SANRUI INTELLIGENT TECHNOLOGY CO., LTD, Nanchang (CN)

(72) Inventors: Qicai Wu, Nanchang (CN); Xiaoguang Wu, Nanchang (CN); Min Wu, Nanchang (CN); Yi Li, Nanchang (CN); Huaqiu Huang, Nanchang (CN)

(73) Assignee: NANCHANG SANRUI INTELLIGENT TECHNOLOGY CO., LTD, Nanchang (CN)

( * ) Notice: Subject to any disclaimer, the term of this patent is extended or adjusted under 35 U.S.C. 154(b) by 115 days.

(21) Appl. No.: 18/073,735

(22) Filed: Dec. 2, 2022

(65) Prior Publication Data

US 2023/0179067 A1  Jun. 8, 2023

(30) Foreign Application Priority Data

Dec. 2, 2021  (CN) .......................... 202111458805.7

(51) Int. Cl.
| | |
|---|---|
| H05K 7/20 | (2006.01) |
| H02K 9/00 | (2006.01) |
| F28F 9/00 | (2006.01) |
| H02K 9/22 | (2006.01) |
| F28F 13/00 | (2006.01) |
| F28F 9/007 | (2006.01) |

(52) U.S. Cl.
CPC ............. *H02K 9/227* (2021.01); *F28F 9/007* (2013.01); *F28F 13/00* (2013.01); *H05K 7/20145* (2013.01)

(58) Field of Classification Search
None
See application file for complete search history.

(56) References Cited

U.S. PATENT DOCUMENTS 6,189,601 B1 * 2/2001 Goodman .................. F28F 1/22
165/104.33
6,446,708 B1 * 9/2002 Lai ...................... H01L 23/3672
165/185

(Continued)

FOREIGN PATENT DOCUMENTS

CN  200958913 Y  10/2007
CN  201373262 Y  12/2009

(Continued)

*Primary Examiner* — Courtney L Smith
(74) *Attorney, Agent, or Firm* — Daniel M. Cohn; Howard M. Cohn

(57) ABSTRACT

An radiator includes a radiator body. A first side of the radiator body defines an arc-shaped heat conducting surface. A second side of the radiator body defines a heat dissipating tooth area. The heat dissipating tooth area includes a middle heat dissipating tooth area and two trunk heat dissipating tooth areas symmetrically arranged on two sides of the middle heat dissipating tooth area. A plurality of first heat dissipating fins is arranged in the middle heat dissipating tooth area. Each of the trunk heat dissipating tooth areas includes a trunk and a plurality of second heat dissipating fins. Each trunk is obliquely arranged on the radiator body. The plurality of second heat dissipating fins is arranged on one side of a corresponding trunk away from the plurality of first heat dissipating fins.

5 Claims, 5 Drawing Sheets

(56) References Cited

U.S. PATENT DOCUMENTS

| | | | | |
|---|---|---|---|---|
| 6,945,319 B1* | 9/2005 | Li | ............................. | F28F 1/32 |
| | | | | 165/185 |
| 7,000,687 B2* | 2/2006 | Ying | .................. | F28D 15/0275 |
| | | | | 174/15.2 |
| 7,583,502 B2* | 9/2009 | Tsao | ...................... | H01L 23/467 |
| | | | | 165/185 |
| 7,643,293 B2* | 1/2010 | Chu | .................... | F28D 15/0275 |
| | | | | 361/679.48 |
| 11,129,309 B2* | 9/2021 | Tsunoda | ................. | H05K 7/209 |
| 2007/0246189 A1* | 10/2007 | Lin | ....................... | H01L 23/467 |
| | | | | 257/E23.102 |
| 2009/0151895 A1* | 6/2009 | Liu | ....................... | H01L 23/467 |
| | | | | 165/80.2 |
| 2009/0321050 A1* | 12/2009 | Guo | ..................... | H01L 23/427 |
| | | | | 165/80.3 |
| 2010/0008045 A1* | 1/2010 | Xu | ........................ | H01L 23/367 |
| | | | | 361/709 |

FOREIGN PATENT DOCUMENTS

| | | |
|---|---|---|
| CN | 201496918 U | 6/2010 |
| CN | 102062379 A | 5/2011 |
| CN | 112235998 A | 1/2021 |

\* cited by examiner

AIR-COOLED RADIATOR

TECHNICAL FIELD

The present disclosure relates to a technical field of motor technology, and in particular to an air-cooled radiator for improving temperature distribution of an iron core in a motor.

BACKGROUND

With increasing power of motors and with miniaturization of the motors, a problem of heat dissipation of the motors is becoming more and more severe. In a conventional split radiator, an iron core and coil winding are uniformly distributed around a circumference thereof. Thus, a temperature in a middle area of the conventional split radiator is lower than a temperature of two sides of the conventional split radiator, which affects an overall heat dissipating effect.

SUMMARY

The present disclosure provides an air-cooled radiator for improving temperature distribution of an iron core in a motor, which makes temperature distribution of the iron core and coil winding uniform and improves reliability and service life of the coil winding.

In order to solve a problem mentioned above, the present disclosure provides the air-cooled radiator for improving the temperature distribution of the iron core in the motor. The air-cooled radiator comprises a radiator body. A first side of the radiator body defines an arc-shaped heat conducting surface. A second side of the radiator body defines a heat dissipating tooth area;

The heat dissipating tooth area comprises a middle heat dissipating tooth area and two trunk heat dissipating tooth areas symmetrically arranged on two sides of the middle heat dissipating tooth area.

A plurality of first heat dissipating fins is arranged in the middle heat dissipating tooth area. Each of the trunk heat dissipating tooth areas comprises a trunk and a plurality of second heat dissipating fins. Each trunk is obliquely arranged on the radiator body. The plurality of second heat dissipating fins is arranged on one side of a corresponding trunk away from the plurality of first heat dissipating fins. A width of each trunk is gradually reduced from a first end of each trunk to a second end of each trunk. The first end of each trunk is close to the radiator body;

One end of the plurality of first heat dissipating fins away from the radiator body forms a concave arc shape.

Each of the trunk heat dissipating tooth area further comprises a plurality of third heat dissipating fins. The plurality of third heat dissipating fins is arranged on one side of a corresponding trunk away from the plurality of second heat dissipating fins.

One end of the plurality of third heat dissipating fins away from the corresponding trunk forms a convex arc shape matched with the one end of the plurality of first heat dissipating fins forming the concave arc shape.

Optionally, two ends of the radiator body define bolt holes configured to match with bolts.

Optionally, the plurality of first heat dissipating fins is arranged at intervals and is parallel to each other.

Optionally, the plurality of second heat dissipating fins is arranged at intervals and is parallel to each other.

Optionally, the plurality of third heat dissipating fins is arranged at intervals and is parallel to each other.

Compared with the prior art, in the present disclosure, the air-cooled radiator makes the temperature distribution of the iron core and the coil winding uniform and improves the reliability and the service life of the coil winding.

Further, the air-cooled radiator of the present disclosure reduces heat transferred to a stator from the iron core close to a keyway and improve reliability and service life of a bearings in a center area of the stator.

BRIEF DESCRIPTION OF DRAWINGS

Accompanying drawings illustrated herein are used further understand the present disclosure and form part of the present disclosure. Schematic embodiments of the present disclosure and their descriptions are used to explain the present disclosure and do not constitute undue limitations of the present disclosure.

In the drawings.

1—radiator body, 2—curved heat conducting surface, 3—bolt hole, 4—second heat dissipating fin, 5—trunk, 6—third heat dissipating fin, 7—first heat dissipating fin.

DETAILED DESCRIPTION

The following is a detailed description of embodiments of the present disclosure with accompanying drawings and examples, so that a process of how to apply technical means to solve technical problems and achieve technical effects of the present disclosure can be fully understood and implemented accordingly.

It should be understood that in the description of the present disclosure terms such as "central", "lateral", "lengthways", "length", "width", "thickness", "upper", "lower", "left", "right", "vertical", "horizontal", "top", "bottom", "inner", "outer", "clockwise", "counterclockwise", etc. indicate direction or position relationships shown based on the drawings, and are only intended to facilitate the description of the present disclosure and the simplification of the description rather than to indicate or imply that the indicated device or element must have a specific direction or constructed and operated in a specific direction, and therefore, shall not be understood as a limitation to the present disclosure.

In addition, terms such as "first" and "second" are only used for the purpose of description, rather than being understood to indicate or imply relative importance or hint the number of indicated technical features. Thus, the feature limited by "first" and "second" can explicitly or impliedly include one or more features. In the description of the present disclosure, the meaning of "a plurality of" is two or more unless otherwise specified.

It should be noted in the description of the present disclosure that, unless otherwise regulated and defined, terms such as "installation," "bonded," and "connection" shall be understood in broad sense, and for example, may refer to fixed connection or detachable connection or integral connection; may refer to mechanical connection or electrical connection; and may refer to direct connection or indirect connection through an intermediate medium or inner communication of two elements. For those of ordinary skill in the art, the meanings of the above terms in the present disclosure may be understood according to concrete conditions.

Figure 1:
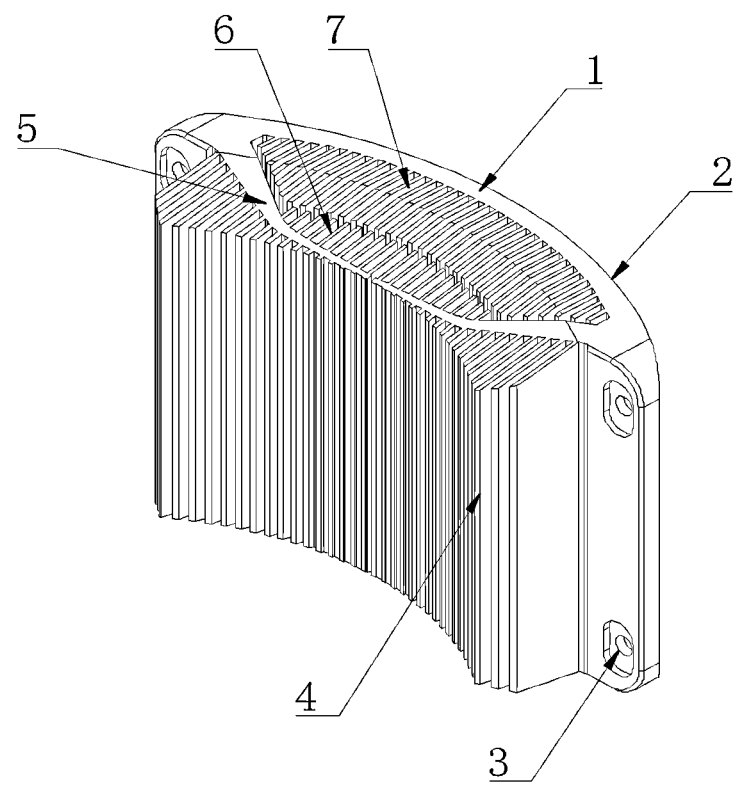
FIG. 1 is a perspective schematic diagram of an air-cooled radiator of the present disclosure.
Figure 2:
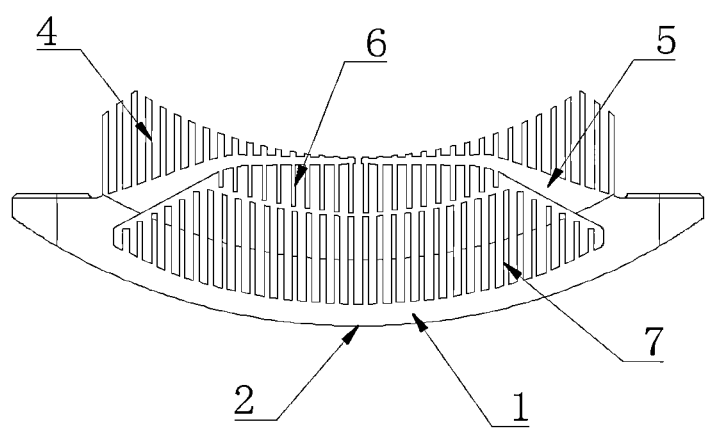
FIG. 2 is a top plan schematic diagram of the air-cooled radiator of the present disclosure.

As shown in FIGS. 1 and 2, in one specific embodiment, the present disclosure provides an air-cooled radiator for improving temperature distribution of an iron core in a motor. The air-cooled radiator comprises a radiator body 1. A first side of the radiator body 1 defines an arc-shaped heat conducting surface 2. A second side of the radiator body defines a heat dissipating tooth area.

The heat dissipating tooth area comprises a middle heat dissipating tooth area and two trunk heat dissipating tooth areas symmetrically arranged on two sides of the middle heat dissipating tooth area.

A plurality of first heat dissipating fins 7 is arranged in the middle heat dissipating tooth area. Each of the trunk heat dissipating tooth areas comprises a trunk 5 and a plurality of second heat dissipating fins 4. Each trunk 5 is obliquely arranged on the radiator body 1. The plurality of second heat dissipating fins 4 is arranged on one side of a corresponding trunk 5 away from the plurality of first heat dissipating fins 7. A width of each trunk 5 is gradually reduced from a first end of each trunk 5 to a second end of each trunk 5. The first end of each trunk 5 is close to the radiator body 1.

In the embodiment, one end of the plurality of first heat dissipating fins 7 away from the radiator body 1 forms a concave arc shape.

In the embodiment, each of the trunk heat dissipating tooth area further comprises a plurality of third heat dissipating fins 6. The plurality of third heat dissipating fins 6 is arranged on one side of a corresponding trunk 5 away from the plurality of second heat dissipating fins 4.

Figure 3:
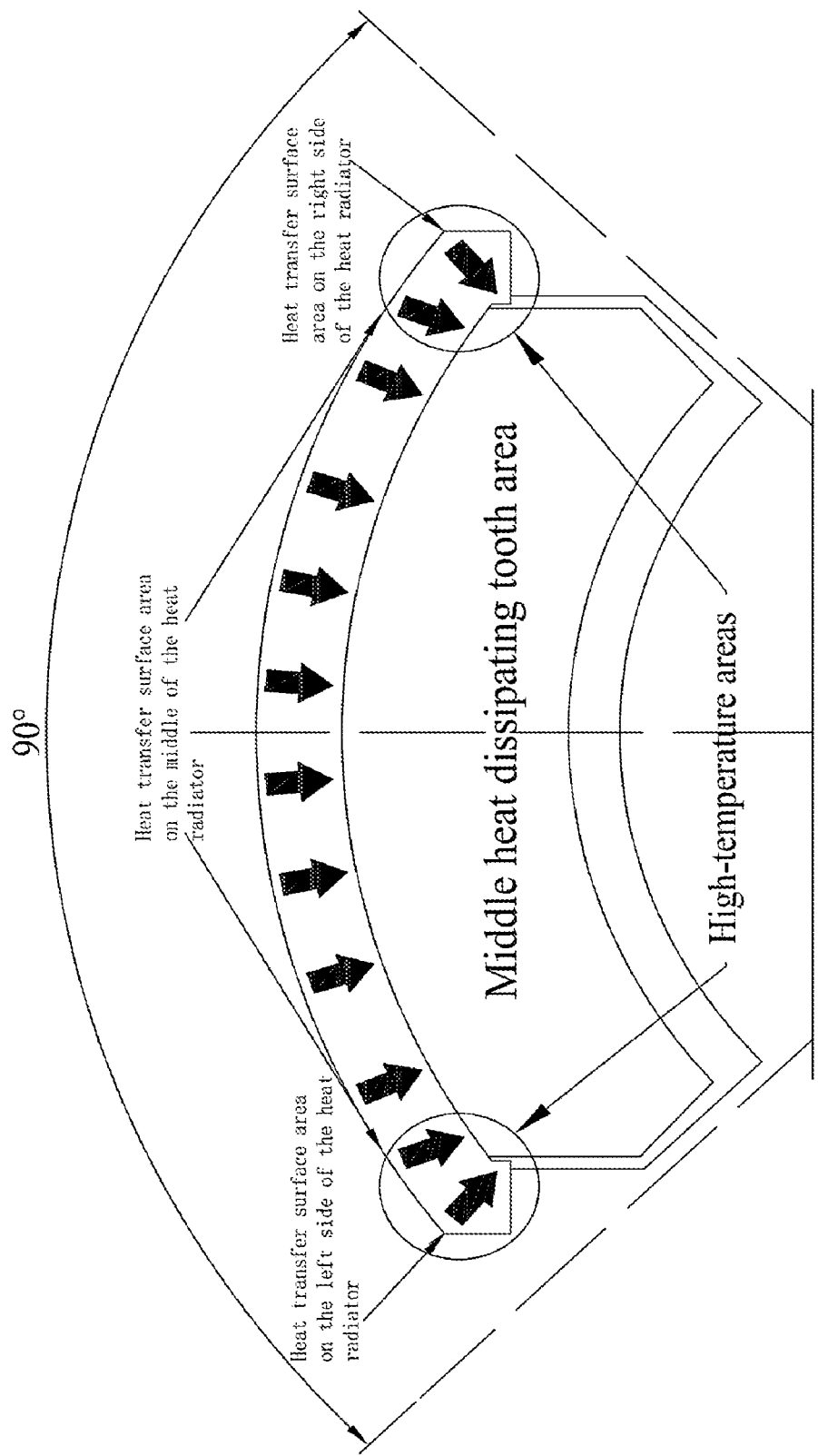
FIG. 3 is a schematic diagram showing functional areas of a radiator in the prior art.

A radiator in the prior art is shown in FIG. 3, the radiator in the prior art only comprises a middle heat dissipating tooth area, and there are no enough heat dissipating fins arranged on two sides of a radiator body, resulting in forming of high-temperature areas on two sides of the radiator body in the prior art.

Figure 4:
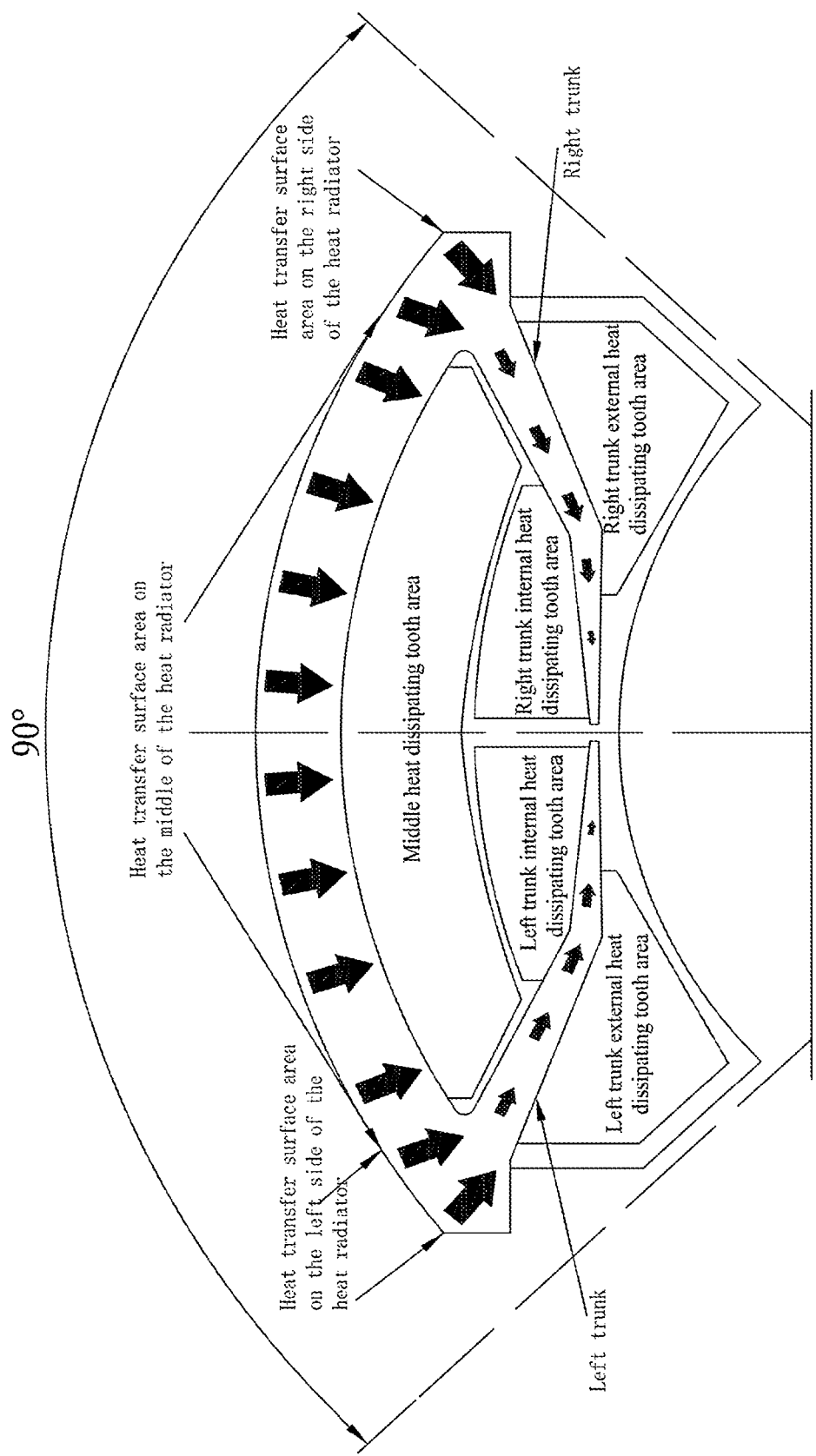
FIG. 4 is a schematic diagram showing functional areas of the air-cooled radiator of the present disclosure.

A specific embodiment of the present disclosure is shown in FIG. 4, where the trunk heat dissipating tooth areas comprise four areas: a left trunk internal heat dissipating tooth area, a right trunk internal heat dissipating tooth area, a left trunk external heat dissipating tooth area, and a right trunk external heat dissipating tooth area.

In the embodiment, one end of the plurality of third heat dissipating fins 6 away from the corresponding trunk 5 forms a convex arc shape matched with the one end of the plurality of first heat dissipating fins forming the concave arc shape.

In the embodiment, two ends of the radiator body 1 define bolt holes 3 configured to match with bolts.

In the embodiment, the plurality of first heat dissipating fins 7 is arranged at intervals and is parallel to each other.

In the embodiment, the plurality of second heat dissipating fins 4 is arranged at intervals and is parallel to each other.

In the embodiment, the plurality of third heat dissipating fins 6 is arranged at intervals and is parallel to each other.

Figure 5:
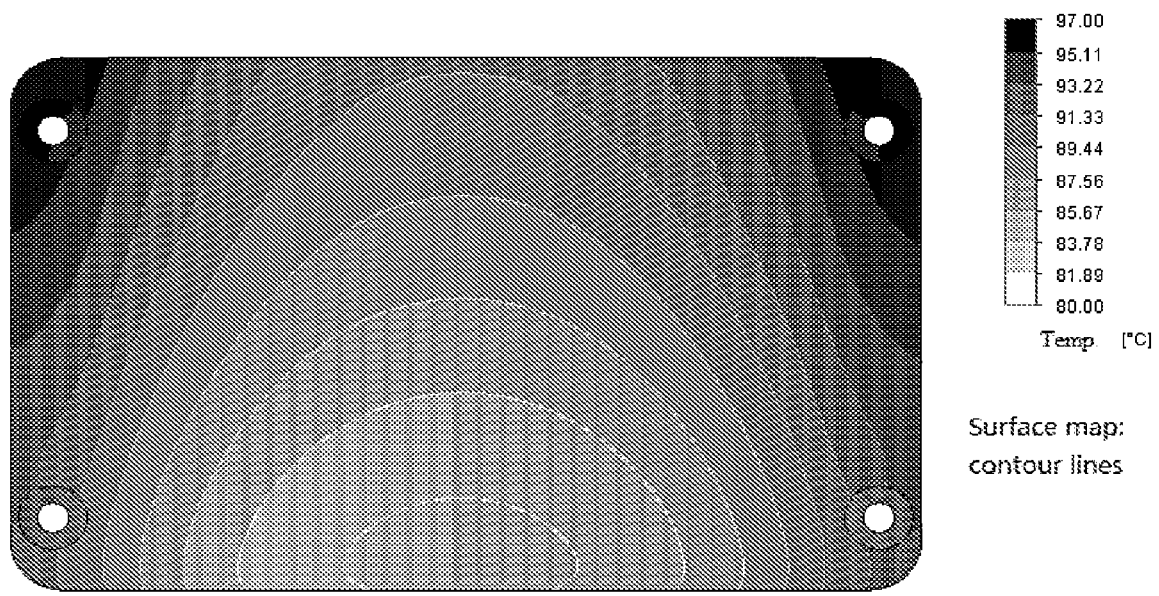
FIG. 5 is a schematic diagram showing the temperature contour plot in the prior art

It should be noted that high-temperature areas on two sides of the radiator body in the prior art are also connecting areas where the radiator in a single quadrant connecting adjacent radiators. As shown in FIG. 5, a temperature contour diagram of the radiator in the prior art shows that a temperature on two sides of the radiator in the prior art is much greater than a middle portion of the radiator along horizontal distribution at a same height. Because there are not enough heat dissipating fins arranged on two sides of the radiator, heat is hardly dissipated on the two sides of the radiator.

Figure 6:
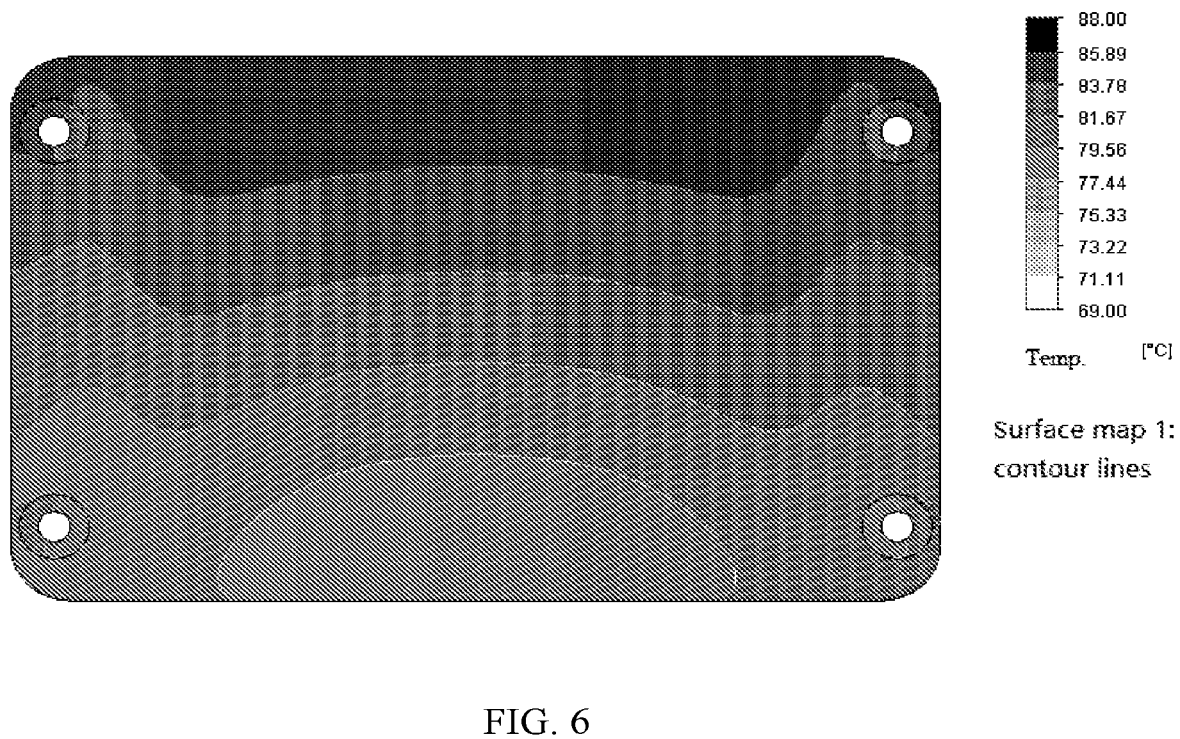
FIG. 6 is a schematic diagram showing the temperature contour plot of the present disclosure.

In order to improve heat dissipation capacity of two sides of the air-cooled radiator, in the present disclosure, a pair of trunks with a large cross section at a root portion is symmetrically arranged on two sides of the radiator body. A width of the cross-section of each trunk is large, which facilitates rapid heat dissipation. Therefore, the temperature distribution of the air-cooled radiator in the embodiment of the present disclosure is uniform in both horizontal distribution and vertical distribution (as shown in FIG. 6). A situation that a high local temperature of the iron core and the coil winding are too high while a temperature of most other areas of the iron core and the coil winding is far below a danger range is avoided. Therefore, a possibility of premature burnout of the iron core and coil winding is avoided. The uniform temperature distribution further reduces damages to the iron core and the coil winding and improves an overall operating efficiency of the motor.

Figure 7:
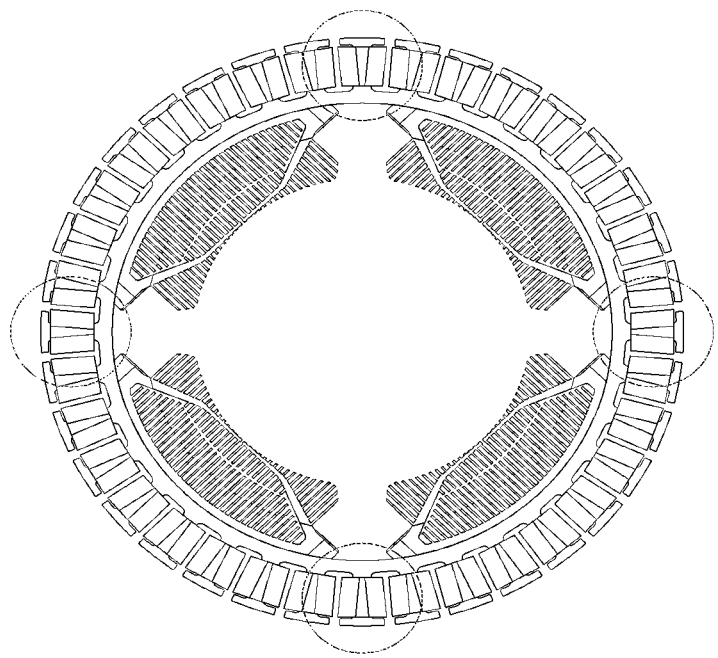
FIG. 7 is a schematic diagram showing coil winding assembled with the air-cooled radiator of the present disclosure.

In the embodiment, adjacent areas of each two air-cooled radiators of the present disclosure (four encircled areas in FIG. 7) of the motor lacks sufficient contact heat dissipating area, resulting in a much higher temperature in the iron core and the coil winding corresponding to the adjacent areas than other areas of the iron core and the coil winding. A temperature difference thereof is about 15-20° C. By adopting the solution of the present disclosure, heat dissipating capacity of the two sides of each air-cooled radiator is significantly improved, making the temperature distribution of the iron core and coil winding uniform. As a result, the temperature difference is basically within 2-4° C.

The above is only a description of the optional embodiment of the present disclosure, and should not be understood as a limitation of the claims. The present disclosure is not limited to the above embodiments, and variations in a specific structure are allowed. All variations made within the protection scope of an independent claim of the present disclosure are within the protection scope of the present disclosure.

What is claimed is:

1. An air-cooled radiator, comprising: a radiator body; wherein a first side of the radiator body defines an arc-shaped heat conducting surface; a second side of the radiator body defines a heat dissipating tooth area;
   wherein the heat dissipating tooth area comprises a middle heat dissipating tooth area and two trunk heat dissipating tooth areas symmetrically arranged on two sides of the middle heat dissipating tooth area;
   wherein a plurality of first heat dissipating fins is arranged in the middle heat dissipating tooth area; each of the trunk heat dissipating tooth areas comprises a trunk and a plurality of second heat dissipating fins; each trunk is obliquely arranged on the radiator body; the plurality of second heat dissipating fins is arranged on one side of a corresponding trunk away from the plurality of first heat dissipating fins; a width of each trunk is gradually reduced from a first end of each trunk to a second end of each trunk; the first end of each trunk is close to the radiator body;

wherein one end of the plurality of first heat dissipating fins away from the radiator body forms a concave arc shape;

wherein each of the trunk heat dissipating tooth areas further comprises a plurality of third heat dissipating fins; the plurality of third heat dissipating fins is arranged on another side of each corresponding trunk away from the plurality of second heat dissipating fins;

wherein one end of the plurality of third heat dissipating fins away from each corresponding trunk forms a convex arc shape matched with the one end of the plurality of first heat dissipating fins forming the concave arc shape.

2. The air-cooled radiator according to claim 1, wherein two ends of the radiator body define bolt holes configured to match with bolts.

3. The air-cooled radiator according to claim 1, wherein the plurality of first heat dissipating fins is arranged at intervals and is parallel to each other.

4. The air-cooled radiator according to claim 1, wherein the plurality of second heat dissipating fins is arranged at intervals and is parallel to each other.

5. The air-cooled radiator according to claim 1, wherein the plurality of third heat dissipating fins is arranged at intervals and is parallel to each other.

\* \* \* \* \*